(12) United States Patent
Tanaka et al.

(10) Patent No.: US 8,591,009 B2
(45) Date of Patent: Nov. 26, 2013

(54) PIEZOELECTRIC FILM, INK JET HEAD, ANGULAR VELOCITY SENSOR AND PIEZOELECTRIC GENERATING ELEMENT

(75) Inventors: Yoshiaki Tanaka, Nara (JP); Takakiyo Harigai, Kyoto (JP); Hideaki Adachi, Osaka (JP); Eiji Fujii, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/616,125

(22) Filed: Sep. 14, 2012

(65) Prior Publication Data

US 2013/0016163 A1  Jan. 17, 2013

Related U.S. Application Data

(63) Continuation of application No. PCT/JP2012/000135, filed on Jan. 12, 2012.

(30) Foreign Application Priority Data

Apr. 14, 2011 (JP) ................................. 2011-089868

(51) Int. Cl.
*H01L 41/00* (2013.01)
*H02N 2/00* (2006.01)
*B41J 2/045* (2006.01)

(52) U.S. Cl.
USPC ............................................ 347/68; 310/311

(58) Field of Classification Search
None
See application file for complete search history.

(56) References Cited

U.S. PATENT DOCUMENTS

| 6,162,293 | A | 12/2000 | Kijima et al. | |
|---|---|---|---|---|
| 7,235,917 | B2 * | 6/2007 | Fukui et al. | 310/364 |
| 7,825,054 | B2 * | 11/2010 | Shimada et al. | 501/139 |
| 2003/0001131 | A1 | 1/2003 | Takase et al. | |
| 2010/0194245 | A1 | 8/2010 | Harigai et al. | |
| 2010/0289383 | A1 | 11/2010 | Harigai et al. | |
| 2011/0072900 | A1 | 3/2011 | Harigai et al. | |
| 2012/0038714 | A1 | 2/2012 | Harigai et al. | |

FOREIGN PATENT DOCUMENTS

| CN | 101981718 A | 2/2011 |
|---|---|---|
| JP | 04-060073 B2 | 9/1987 |
| JP | 10-182291 A | 7/1998 |
| JP | 2001-151566 A | 6/2001 |

(Continued)

OTHER PUBLICATIONS

Yiping Guo, "Structure and electrical properties of trilayered BaTi03/(Na0.5Bi0.5)Ti03-BaTi03lBaTi03 thin films deposited on Si substrate" Solid State Communications, Jan. 2009, vol. 149 No. 1-2, p. 14-17.*

(Continued)

*Primary Examiner* — Matthew Luu
*Assistant Examiner* — Erica Lin
(74) *Attorney, Agent, or Firm* — McDermott Will & Emery LLP

(57) ABSTRACT

The purpose of the present invention is to provide a BNT-BT piezoelectric film having a higher crystalline orientation, a higher piezoelectric constant, and a higher ferroelectric property. The present invention is directed to a piezoelectric film comprising a first electrode having only a (110) orientation; a (NaxBi0.5)TiO0.5x+2.75—BaTiO layer having only a (110) orientation, a (Bi,Na)TiO3—BaTiO3 layer having only a (110) orientation, and a second electrode, wherein a value of x is not less than 0.29 and not more than 0.40, and the first electrode, the (NaxBi0.5)TiO0.5x+2.75—BaTiO3 layer, the (Bi,Na)TiO3—BaTiO3 layer, and the second electrode are laminated in this order.

7 Claims, 9 Drawing Sheets

(56) References Cited

FOREIGN PATENT DOCUMENTS

| | | |
|---|---|---|
| JP | 2001-261435 A | 9/2001 |
| JP | 2007-266346 A | 10/2007 |
| JP | 4455678 B1 | 4/2010 |
| JP | 4835813 B1 | 10/2011 |
| JP | 2011-249489 A | 12/2011 |
| WO | WO-2010/047049 A1 | 4/2010 |
| WO | WO-2010/084711 A1 | 7/2010 |
| WO | WO-2011/129072 A1 | 10/2011 |
| WO | WO-2011/158491 A1 | 12/2011 |

OTHER PUBLICATIONS

International Search Report mailed Apr. 3, 2012 issued in corresponding International Application No. PCT/JP2012/000135.

Yiping Guo, "Structure and electrical properties of trilayered $BaTiO_3/(Na_{0.5}Bi_{0.5})TiO_3\text{-}BaTiO_3/BaTiO_3$ thin films deposited on Si substrate" Solid State Communications, Jan. 2009, vol. 149 No. 1-2, p. 14-17.

* cited by examiner

PIEZOELECTRIC FILM, INK JET HEAD, ANGULAR VELOCITY SENSOR AND PIEZOELECTRIC GENERATING ELEMENT

This is a continuation of International Application No. PCT/JP2012/000135, with an international filing date of Jan. 12, 2012, which claims priority of Japanese Patent Application No. 2011-089868, filed on Apr. 14, 2011, the contents of which are hereby incorporated by reference.

TECHNICAL FIELD

The present invention relates to a piezoelectric film, an ink jet head, a n angular velocity sensor and a piezoelectric generating element.

BACKGROUND ART

One example of lead-free piezoelectric materials that are currently under development is a perovskite-type composite oxide (Bi,Na)TiO$_3$—BaTiO$_3$ as disclosed in Patent Literature 1 and Patent Literature 2 (which corresponds to U.S. Pat. No. 7,870,787). This piezoelectric material is referred to as "BNT-BT".

CITATION LIST

Patent Literatures

[Patent Literature 1] Japanese Patent Publication No. H04-060073
[Patent Literature 2] Japanese Patent Publication No. 4455678
[Patent Literature 3] International publication No. 2010/047049
[Patent Literature 4] U.S. Pat. No. 7,870,787
[Patent Literature 5] Chinese Laid-open patent application publication No. 101981718

SUMMARY OF INVENTION

Technical Problem

The purpose of the present invention is to provide a BNT-BT piezoelectric film having a higher crystalline orientation, a higher piezoelectric constant, and a higher ferroelectric property.

Another purpose of the present invention is to provide an ink jet head, an angular velocity sensor, and a piezoelectric generating element, each including the BNT-BT piezoelectric film Still another purpose of the present invention is to provide a method of forming an image by this ink jet head, a method of measuring an angular velocity by this angular velocity sensor, and a method of generating electric power using this piezoelectric generating element.

Solution to Problem

A piezoelectric film of the present invention comprises:
a first electrode having only a (110) orientation,
a (Na$_x$Bi$_{0.5}$)TiO$_{0.5x+2.75}$—BaTiO3layer having only a (110) orientation,
a (Bi,Na)TiO$_3$—BaTiO$_3$ layer having only a (110) orientation, and
a second electrode, wherein
a value of x is not less than 0.29 and not more than 0.40, and the first electrode (13), the (Na$_x$Bi$_{0.5}$)TiO$_{0.5x+2.75}$—BaTiO$_3$layer (14), the (Bi,Na)TiO3-BaTiO$_3$ layer (15), and the second electrode (17) are laminated in this order.

Advantageous Effects Of Invention

The present invention provides a BNT-BT piezoelectric film having a higher crystalline orientation, a higher piezoelectric constant, and a higher ferroelectric property.

DESCRIPTION OF EMBODIMENTS

Figure 1A:
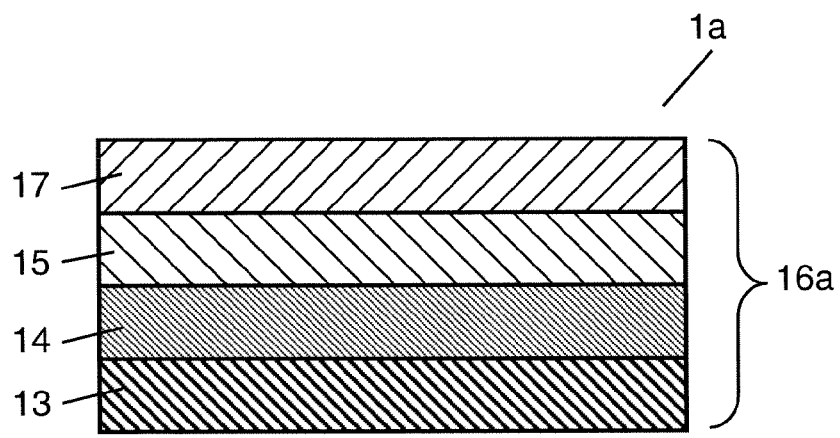
FIG. 1A is a cross-sectional view schematically showing an embodiment of a piezoelectric film of the present invention.

Hereinafter, embodiments of the present invention will be described. In the following description, the same reference numerals are used to designate the same elements and parts, and therefore the overlapping description thereof can be omitted.

[Piezoelectric Film]
FIG. 1A shows one embodiment of a piezoelectric film according to the present invention. A piezoelectric film la shown in FIG. 1A has a multilayer structure 16a. The multilayer structure 16a has a first electrode 13 having only a (110) orientation, a (Na$_x$Bi$_{0.5}$)TiO$_{0.5x+2.75}$—BaTiO$_3$layer 14 (0.29≤x≤0.4) having only a (110) orientation, a (Bi,Na) TiO$_3$—BaTiO$_3$ layer 15 having only a (110) orientation, and a second electrode 17 in this order. The first electrode 13 and the second electrode 17 have a shape of a layer. The (Na$_x$Bi$_{0.5}$) TiO$_{0.5x+2.75}$—BaTiO$_3$layer 14 is an interface layer. The (Bi, Na)TiO$_3$—BaTiO$_3$ layer 15 is a piezoelectric layer.

The (Bi,Na)TiO$_3$—BaTiO$_3$ layer 15 has a small leak current property, high crystallinity, and a high (110) orientation. This allows the piezoelectric film la to have a low dielectric loss property and high piezoelectric performance comparable to that of PZT, although it contains no lead.

(Regarding First Electrode 13)

An example of the first electrode 13 having only a (110) orientation is described below:

(1) a metal layer such as a platinum (Pt) layer, a palladium (Pd) layer, or a gold (Au) layer, or (2) a conductive oxide layer such as a nickel oxide (NiO) layer, a ruthenium oxide ($RuO_2$) layer, an iridium oxide ($IrO_9$) layer, a strontium ruthenate ($SrRuO_3$) layer, or a lanthanum-nickelate ($LaNiO_3$) layer.

A platinum layer is preferred. Two or more of these layers may also be used.

(Regarding $(Na_xBi_{0.5})TiO_{0.5x+2.75}$—$BaTiO_3$ Layer 14)

The $(Na_xBi_{0.5})TiO_{0.5x+2.75}$—$BaTiO_3$ layer 14 ($0.29 \leq x \leq 0.4$) has a plane orientation of (110) on its surface. The $(Na_xBi_{0.5})TiO_{0.5x+2.75}$—$BaTiO3$ layer 14 ($0.29 \leq x \leq 0.4$) is an interface layer. The $(Na_xBi_{0.5})TiO_{0.5x+2.75}$—$BaTiO_3$ layer 14 ($0.29 \leq x \leq 0.4$) is sandwiched between the first electrode 13 and the $(Bi,Na)TiO_3$—$BaTiO_3$ layer 15. The $(Na_xBi_{0.5})TiO_{0.5x+2.75}$—$BaTiO_3$ layer 14 ($0.29 \leq x \leq 0.4$) is necessary to improve the crystalline orientation, the piezoelectric constant, and the ferroelectric property of the $(Bi,Na)TiO_3$—$BaTiO_3$ layer 15. For more detail, see Examples 1 to 3 and Comparative Examples 1 to 10, which are described later.

A value of "0.5x+2.75", which represents an oxygen amount in sodium bismuth titanate, may include an error. For example, in a case where x=0.4, the value of "0.5x+2.75" is equal to 2.95. However, in the case where x=0.4, the oxygen amount in sodium bismuth titanate does not always correspond with 2.95 completely.

It is difficult to estimate the composition of the interface layer suitable for improving the crystalline orientation, the piezoelectric constant, and the ferroelectric property of the $(Bi,Na)TiO_3$—$BaTiO_3$ layer 15, based on the similarity of the lattice constants or the compositions of these piezoelectric layer and interface layer. In other words, such a piezoelectric layer cannot always be obtained simply by providing an interface layer having a lattice constant or a composition similar to that of the piezoelectric layer. This is because it is generally difficult to form a multicomponent composite oxide having high crystallinity and a high orientation, like $(Bi,Na)TiO_3$—$BaTiO_3$, due to a difference in the vapor pressure of constituent elements (except for oxygen) of the oxide. The present inventors have discovered that the $(Na_xBi_{0.5})TiO_{0.5x+2.75}$—$BaTiO3$ layer 14 ($0.29 \leq x \leq 0.4$) improves the crystalline orientation, the piezoelectric constant, and the ferroelectric property of the $(Bi,Na)TiO_3$—$BaTiO_3$ layer 15.

The thickness of the $(Na_xBi_{0.5})TiO_{0.5x+2.75}$—$BaTiO3$ layer 14 ($0.29 \leq x \leq 0.4$) is not limited. The thickness of at least several lattice units (about 2 nm) is large enough to improve the crystalline orientation and the piezoelectric constant of the $(Bi,Na)TiO_3$—$BaTiO_3$ layer 15.

The $(Na_xBi_{0.5})TiO_{0.5x+2.75}$—$BaTiO_3$ layer 14 ($0.29 \leq x \leq 0.4$) has a perovskite-type crystal structure represented by the chemical formula $ABO_3$. The main component of the site of A is Na, Bi and Ba. The main component of the site of B is Ti. The $(Na_xBi_{0.5})TiO_{0.5x+2.75}$—$BaTiO_3$ layer 14 ($0.29 \leq x \leq 0.4$) may contain a small amount of impurities. The impurities may be typically K, Li, or Ag, which substitutes for Na.

A (110)-oriented layer (not shown) further may be sandwiched between the first electrode 13 and the $(Na_xBi_{0.5})TiO_{0.5x+2.75}$—$BaTiO_3$ layer 14 ($0.29 \leq x \leq 0.4$) as necessary. The (110)-oriented layer is, for example, a $LaNiO_3$ layer or a $SrRuO_3$ layer.

(Regarding $(Bi,Na)TiO_3$—$BaTiO_3$ Layer 15)

The $(Bi,Na)TiO_3$—$BaTiO_3$ layer 15 is made of $(Bi,Na)TiO_3$—$BaTiO_3$. The $(Bi,Na)TiO_3$—$BaTiO_3$ layer 15 has a plane orientation of (110) on its surface.

The thickness of the $(Bi,Na)TiO_3$—$BaTiO_3$ layer 15 is not limited. The thickness thereof is at least 0.5 micrometers but not more than 10 micrometers, for example. Although the $(Bi,Na)TiO_3$—$BaTiO_3$ layer 15 is such a thin layer, it has a low dielectric loss property and high piezoelectric performance.

The $(Bi,Na)TiO_3$—$BaTiO_3$ layer 15 has a perovskite-type crystal structure represented by the chemical formula $ABO_3$. The A site and B site in the perovskite structure have average valences of 2 and 4, respectively, depending on the placement of a single element or a plurality of elements. The A site is Bi, Na, and Ba. The B site is Ti. The $(Bi,Na)TiO_3$—$BaTiO_3$ layer 15 may contain a minute amount of impurities. The impurities typically are Li and K to substitute for Na, and Sr and Ca to substitute for Ba, in the A site. The impurities typically are Zr to substitute for Ti in the B site. Examples of the other impurities include Mn, Fe, Nb, and Ta. Some of these impurities can improve the crystalline orientation and piezoelectric performance of the $(Bi,Na)TiO_3$—$BaTiO_3$ layer 15.

A (110)-oriented layer further may be sandwiched between the $(Na_xBi_{0.5})TiO_{0.5x+2.75}$—$BaTiO_3$ layer 14 and the $(Bi,Na)TiO_3$—$BaTiO_3$ layer 15 as necessary.

(Regarding Second Electrode 17)

The second electrode 17 is composed of a conductive material. An example of the material is a metal having low electric resistant. The material may be a conductive oxide such as NiO, $RuO_2$, $IrO_3$, $SrRuO_3$, or $LaNiO_3$. The second electrode 17 may be composed of two or more of these materials.

The first electrode 13 and the second electrode 17 are used for applying a voltage to the $(Bi,Na)TiO_3$—$BaTiO_3$ layer 15.

An adhesive layer improving adhesion between the second electrode 17 and the $(Bi,Na)TiO_3$—$BaTiO_3$ layer 15 may be provided therebetween. Examples of the material of the adhesive layer include titanium (Ti), tantalum (Ta), iron (Fe), cobalt (Co), nickel (Ni), chrome (Cr), and a compound thereof. The adhesive layer may be composed of two or more of these materials. The adhesive layer may be omitted depending on the adhesion between the second electrode 17 and the $(Bi,Na)TiO_3$—$BaTiO_3$ layer 15.

Figure 1B:
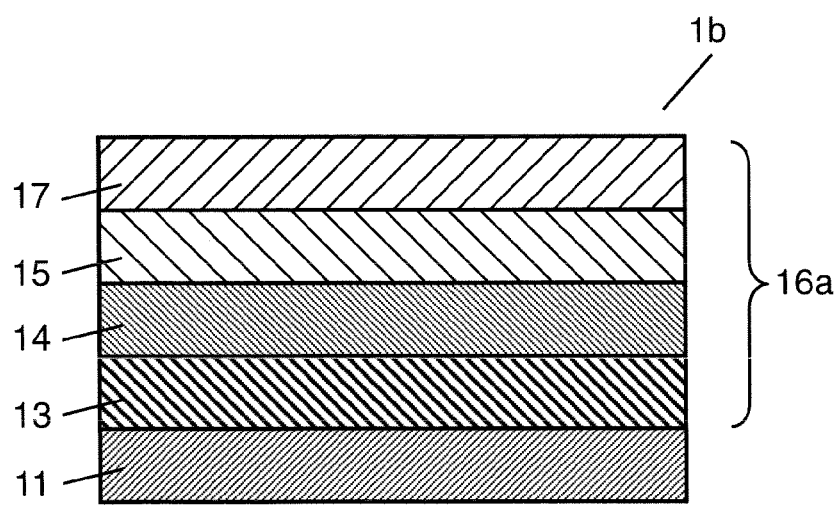
FIG. 1B is a cross-sectional view schematically showing another embodiment of the piezoelectric film of the present invention.

FIG. 1B shows another embodiment of the piezoelectric film according to the present invention. As shown in FIG. 1B, this piezoelectric film 1b comprises a substrate 11 and the multilayer structure 16a. The first electrode 13 is interposed between the substrate 11 and the $(Na_xBi_{0.5})TiO_{0.5x+2.75}$—$BaTiO_3$ layer 14.

The substrate 11 may be a silicon (Si) substrate or a magnesium oxide (MgO) substrate. It is preferred that the substrate 11 is a monocrystalline substrate having only a (110) orientation.

An adhesive layer improving adhesion between the substrate 11 and the first electrode 13 may be provided therebetween. Examples of the material of the adhesive layer include titanium (Ti), tantalum (Ta), iron (Fe), cobalt (Co), nickel (Ni), chrome (Cr), and a compound thereof. The adhesive layer may be composed of two or more of these materials. The adhesive layer may be omitted depending on the adhesion between the substrate 11 and the multilayer structure 16a.

The ink jet head, the angular velocity sensor, and the piezoelectric power generation element each comprising the above-mentioned piezoelectric film are described. For more detail, see Patent Literature 3. Patent Literature 4 and Patent Literature 5 are the United States patent publication and the Chinese laid-open patent application publication which correspond to Patent Literature 3, respectively.

[Ink Jet Head]

An ink jet head of the present invention will be described below with reference to FIG. 4 to FIG. 6.

Figure 4:
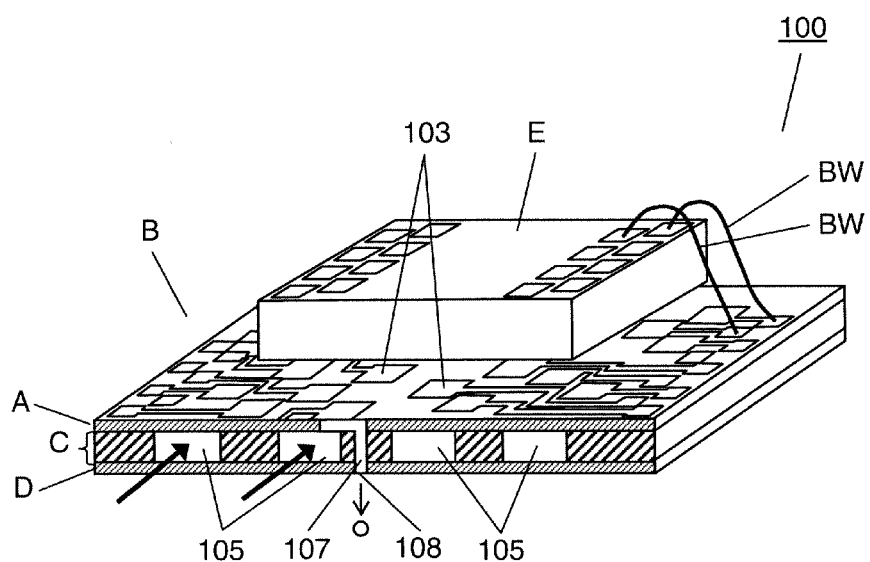
FIG. 4 is a perspective view schematically showing an example of an ink jet head of the present invention and partially showing a cross section of the ink jet head.

FIG. 4 shows one embodiment of the ink jet head of the present invention. FIG. 5 is an exploded view showing main parts including a pressure chamber member and an actuator part in an ink jet head 100 shown in FIG. 4.

Figure 5:
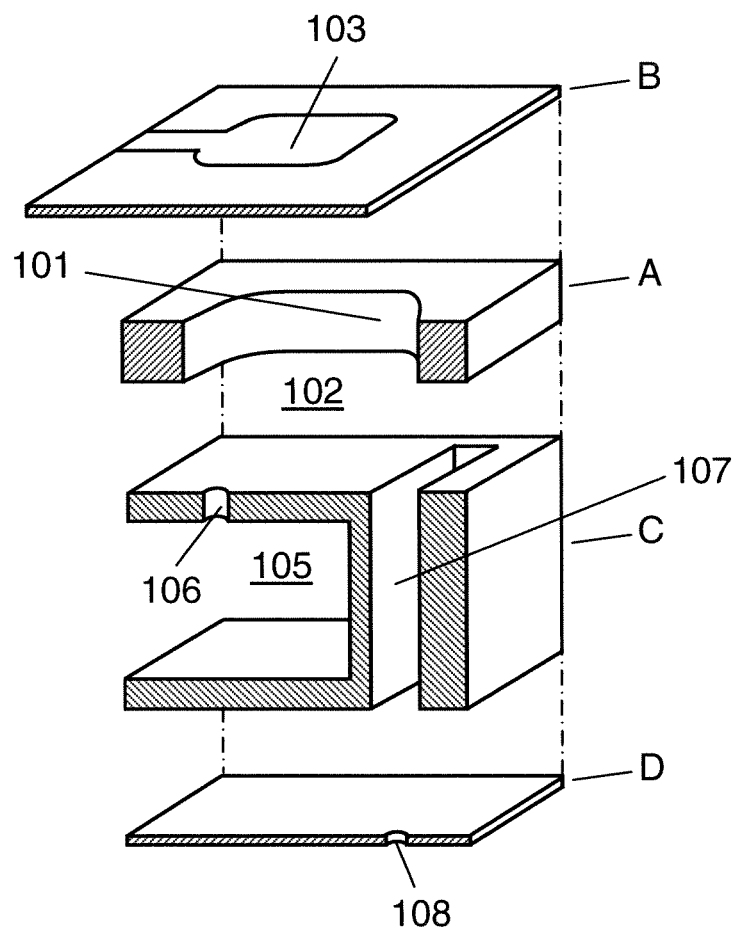
FIG. 5 is an exploded perspective view schematically showing main parts including a pressure chamber member and an actuator part in the ink jet head shown in FIG. 4 and partially showing a cross section of the main parts.

The reference character A in FIG. 4 and FIG. 5 indicates a pressure chamber member. The pressure chamber member A includes through-holes 101 that penetrate therethrough in its thickness direction (in the vertical direction in these diagrams). The through-hole 101 shown in FIG. 5 is a part of the through-hole 101 in the cross section in the thickness direction of the pressure chamber member A. The reference character B indicates an actuator part including piezoelectric films and vibration layers. The reference character C indicates an ink passage member including common liquid chambers 105 and ink passages 107. The pressure chamber member A, the actuator part B, and the ink passage member C are bonded to each other so that the pressure chamber member A is sandwiched between the actuator part B and the ink passage member C. When the pressure chamber member A, the actuator part B, and the ink passage member C are bonded to each other, each of the through-holes 101 forms a pressure chamber 102 for storing ink supplied from the common liquid chamber 105.

The actuator part B has piezoelectric films and vibration layers that are aligned over the corresponding pressure chambers 102 respectively in plan view. In FIG. 4 and FIG. 5, the reference numeral 103 indicates an individual electrode layer that is a part of the piezoelectric film. As shown in FIG. 4, in the ink jet head 100, a plurality of individual electrode layers 103, that is, piezoelectric films are arranged in a zigzag pattern in plan view.

The ink passage member C has the common liquid chambers 105 arranged in stripes in plan view. In FIG. 4 and FIG. 5, each of the common liquid chambers 105 is aligned over a plurality of pressure chambers 102 in plan view. The common liquid chambers 105 extend in the ink supply direction (in the direction indicated by arrows in FIG. 4) in the ink jet head 100. The ink passage member C has supply ports 106, each of which supplies the ink in the common liquid chamber 105 to one of the pressure chambers 102, and ink passages 107, each of which ejects the ink in the corresponding pressure chamber 102 through the corresponding nozzle hole 108. Usually, one pressure chamber 102 has one supply port 106 and one nozzle hole 108. The nozzle holes 108 are formed in a nozzle plate D. The nozzle plate D is bonded to the ink passage member C so that the nozzle plate D and the pressure chamber member A sandwich the ink passage member C therebetween.

In FIG. 4, the reference character E indicates an IC chip. The IC chip E is connected electrically to the individual electrode layers 103, which are exposed on the surface of the actuator part B, through bonding wires BW. For simplicity of FIG. 4, only a part of the bonding wires BW are shown in FIG. 4.

FIG. 5 shows the configuration of the main parts including the pressure chamber member A and the actuator part B. FIG. 6 shows the cross section perpendicular to the ink supply direction (in the direction indicated by the arrows in FIG. 4) in the pressure chamber member A and the actuator part B. The actuator part B includes piezoelectric films 104 (104a to 104d) each having the piezoelectric layer 15 sandwiched between the first electrode (the individual electrode layer 103) and the second electrode (the common electrode layer 112). The individual electrode layers 103 correspond one to one to the piezoelectric films 104a to 104d. The common electrode layer 112 is a single layer electrode that is common to the piezoelectric films 104a to 104d.

Figure 6:
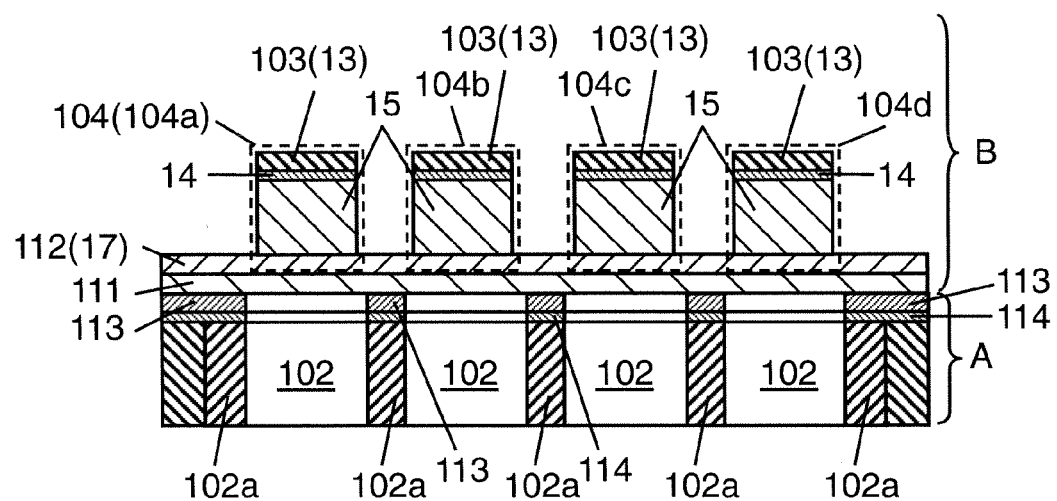
FIG. 6 is a cross-sectional view schematically showing an example of the main parts including the pressure chamber member and the actuator part in the ink jet head shown in FIG. 4.

As surrounded by the dashed-line in FIG. 6, the above-mentioned piezoelectric films 104 are arranged in the ink jet head. The piezoelectric film is the piezoelectric film described in the item titled as "Piezoelectric Film".

[Image Forming Method by Ink Jet Head]

An image forming method of the present invention includes, in the above-described ink jet head of the present invention, a step of applying a voltage to the piezoelectric layer through the first and second electrodes (that is, the individual electrode layer and the common electrode layer) to displace, by the piezoelectric effect, the vibration layer in its film thickness direction so that the volumetric capacity of the pressure chamber changes; and a step of ejecting the ink from the pressure chamber by the displacement.

The voltage to be applied to the piezoelectric layer is changed with the relative position between the ink jet head and an object like a sheet of paper, on which an image is to be formed, being changed, so as to control the timing of ink ejection from the ink jet head and the amount of ink ejected therefrom. As a result, an image is formed on the surface of the object. The term "image" used in the present description includes characters. In other words, according to the present method of forming an image, characters, a picture, or a figure is printed on a print target such as a sheet of paper. With this method, a picturesque image can be printed.

[Angular Velocity Sensor]

Figure 7:
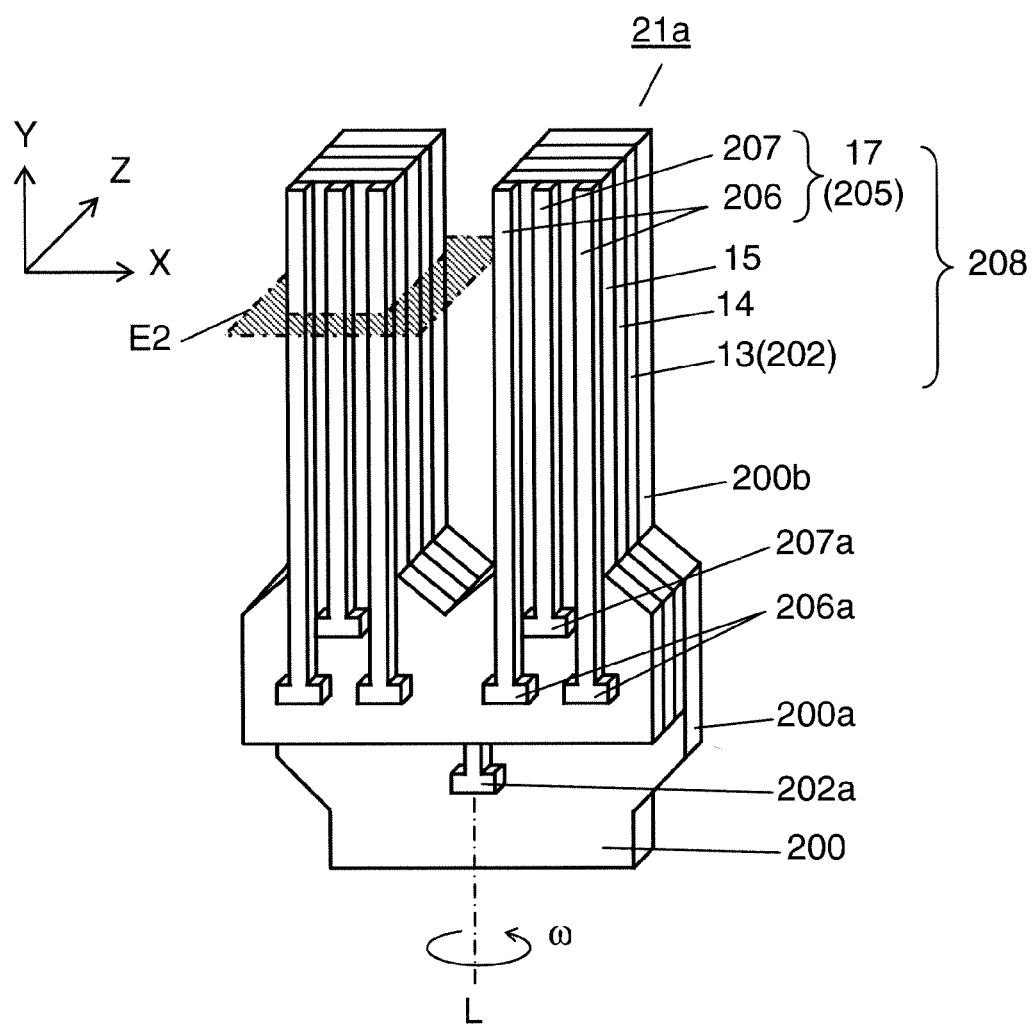
FIG. 7 is a perspective view schematically showing an example of an angular velocity sensor of the present invention.
Figure 8:
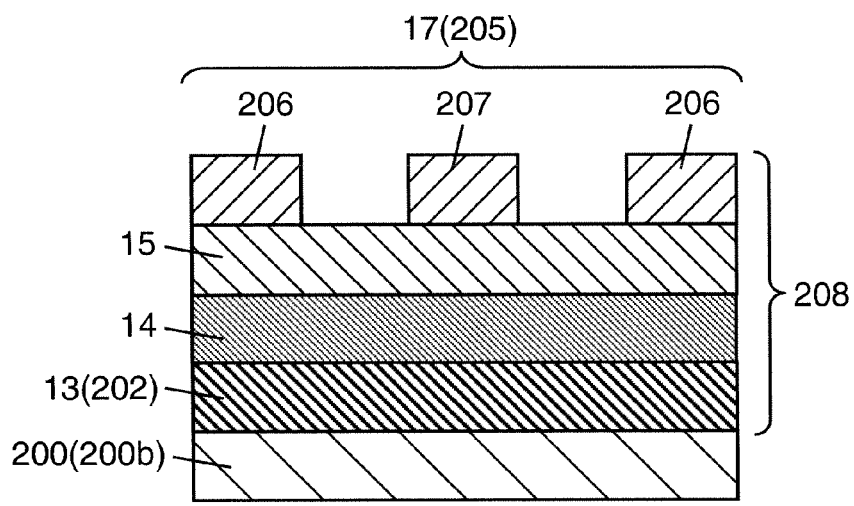
FIG. 8 is a cross-sectional view showing a cross section El of the angular velocity sensor shown in FIG. 7.

FIG. 7 shows an example of an angular velocity sensor of the present invention. FIG. 8 shows a cross section E1 of an angular velocity sensor 21a shown in FIG. 7. The angular velocity sensor 21a shown in FIG. 7 is a so-called tuning-fork type angular velocity sensor. This type of angular velocity sensor can be used in a navigation apparatus for a vehicle, and as a sensor for correcting image blurring due to hand movement in a digital still camera.

The angular velocity sensor 21a shown in FIG. 7 includes a substrate 200 having vibration parts 200b and piezoelectric films 208 bonded to the vibration parts 200b.

The substrate 200 has a stationary part 200a and a pair of arms (vibration parts 200b) extending in a predetermined direction from the stationary part 200a. The direction in which the vibration parts 200b extend is the same as the direction in which the central axis of rotation L of the angular velocity detected by the angular velocity sensor 21a extends. Particularly, it is the Y direction in FIG. 7. The substrate 200 has a shape of a tuning fork including two arms (vibration parts 200b), when viewed from the thickness direction of the substrate 200 (the Z direction in FIG. 7).

The material of the substrate 200 is not limited. The material is, for example, Si, glass, ceramic, or metal. A monocrystalline Si substrate can be used as the substrate 200. The thickness of the substrate 200 is not limited as long as the functions of the angular velocity sensor 21a can develop. More particularly, the substrate 200 has a thickness of at least 0.1 mm but not more than 0.8 mm. The thickness of the stationary part 200a can be different from that of the vibration part 200b.

The piezoelectric film 208 is bonded to the vibration part 200b. The piezoelectric film 208 is the piezoelectric film described in the item titled as "Piezoelectric Film". As shown in FIG. 7 and FIG. 8, the piezoelectric film 208 comprises the first electrode 13 (202), the interface layer 14, the piezoelectric layer 15, and the second electrode 17 (205).

The second electrode 205 has an electrode group including a drive electrode 206 and a sense electrode 207. The drive electrode 206 applies a driving voltage that oscillates the vibration part 200b to the piezoelectric layer 15. The sense electrode 207 measures the deformation of the vibration part 200b caused by an angular velocity applied to the vibration part 200b. That is, the vibration part 200b usually oscillates in the width direction thereof (the X direction in FIG. 7). More particularly, in the angular velocity sensor shown in FIG. 7, a pair of drive electrodes 206 are provided on both of the width-direction edge portions of the vibration part 200b along the length direction thereof (the Y direction in FIG. 7). Only one drive electrode 206 may be provided on one of the width-direction edge portions of the vibration part 200b. In the angular velocity sensor shown in FIG. 7, the sense electrode 207 is provided along the length direction of the vibration part 200b and sandwiched between the pair of drive electrodes 206. A plurality of sense electrodes 207 may be provided on the vibration part 200b. The deformation of the vibration part 200b measured by the sense electrode 207 usually is a deflection in the thickness direction thereof (the Z direction in FIG. 7).

In the angular velocity sensor of the present invention, one electrode selected from the first electrode and the second electrode can be composed of an electrode group including the drive electrode and the sense electrode. In the angular velocity sensor 21a shown in FIG. 7, the second electrode 205 is composed of the electrode group. Unlike this angular velocity sensor, a first electrode 202 can be composed of the electrode group.

The first electrode 202, the drive electrode 206, and the sense electrode 207 have connection terminals 202a, 206a, and 207a, respectively, formed at the end portions thereof. The shape and position of each of the connection terminals are not limited. In FIG. 7, the connection terminals are provided on the stationary part 200a.

In the angular velocity sensor shown in FIG. 7, the piezoelectric film 208 is bonded to both the vibration part 200b and the stationary part 200a. The bonding state of the piezoelectric film 208 is not limited as long as the piezoelectric film 208 can oscillate the vibration part 200b and measure the deformation of the vibration part 200b. For example, the piezoelectric film 208 may be bonded only to the vibration part 200b.

The angular velocity sensor of the present invention may have two or more vibration part groups each consisting of a pair of vibration parts 200b. Such an angular velocity sensor can serve as a biaxial or triaxial angular velocity sensor capable of measuring angular velocities with respect to a plurality central axes of rotation. The angular velocity sensor shown in FIG. 7 has one vibration part group consisting of a pair of vibration parts 200b.

[Method of Measuring Angular Velocity by Angular Velocity Sensor]

The angular velocity measuring method of the present invention uses the angular velocity sensor of the present invention, and includes the steps of applying a driving voltage to the piezoelectric layer to oscillate the vibration part of the substrate; and measuring the deformation of the vibration part caused by an angular velocity applied to the oscillating vibration part to obtain a value of the applied angular velocity. The driving voltage is applied between the drive electrode and one of the first electrode and the second electrode (the other electrode) that serves neither as the drive electrode nor as the sense electrode, and thus the driving voltage is applied to the piezoelectric layer. The sense electrode and the other electrode measure the deformation of the oscillating vibration part caused by the angular velocity.

Hereinafter, the angular velocity measuring method by the angular velocity sensor 21a shown in FIG. 7 is described. A driving voltage having a frequency that resonates with the natural vibration of the vibration part 200b is applied to the piezoelectric layer 15 through the first electrode 202 and the drive electrode 206 so as to oscillate the vibration part 200b. The driving voltage can be applied, for example, by grounding the first electrode 202 and changing the potential of the drive electrode 206 (in other words, the driving voltage is the potential difference between the first electrode 202 and the drive electrode 206). The angular velocity sensor 21a includes a pair of vibration parts 200b that are arranged in the form of the tuning fork. Usually, reverse (positive and negative) voltages are applied to the drive electrodes 206 provided on the respective vibration parts 200b of the pair. This allows the respective vibration parts 200b to oscillate in the mode in which they vibrate in the directions opposite to each other (the mode in which they vibrate symmetrically with respect to the central axis of rotation L shown in FIG. 7). In the angular velocity sensor 21a shown in FIG. 7, the vibration parts 200b oscillate in their width direction (the X direction). The angular velocity can be measured by oscillating only one of the pair of vibration parts 200b. For accurate measurement, however, it is preferable to oscillate both of the vibration parts 200b in the mode in which they vibrate in the directions opposite to each other.

When an angular velocity ω with respect to the central axis of rotation L is applied to the angular velocity sensor 21a in which the vibration parts 200b are oscillating, the vibration parts 200b are deflected respectively in their thickness directions (the Z direction) by Coriolis force. In the case where the respective vibration parts 200b are oscillating in the mode in which they vibrate in the directions opposite to each other, they are deflected in the opposite directions by the same degree. The piezoelectric layer 15 bonded to the vibration part 200b is also deflected according to this deflection of the vibration part 200b. As a result, a potential difference is generated between the first electrode 202 and the sense electrode 207 in accordance with the deflection of the piezoelectric layer 15, that is, the magnitude of the generated Coriolis force. The angular velocity ω applied to the angular velocity sensor 21a can be measured by measuring the magnitude of the potential difference.

The following relationship between a Coriolis force Fc and an angular velocity ω is true:

$$Fc = 2mv\omega$$

where v is the velocity of the oscillating vibration part 200b in the oscillation direction, and m is the mass of the vibration part 200b. As shown in this equation, the angular velocity w can be calculated from the Coriolis force Fc.

[Piezoelectric Generating Element]

Figure 9:
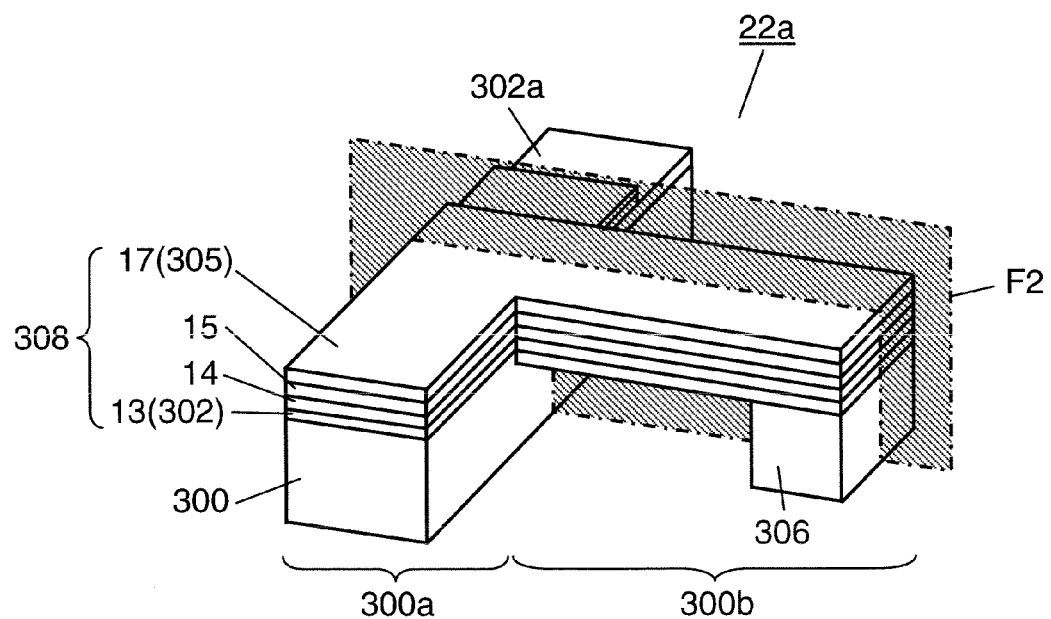
FIG. 9 is a perspective view schematically showing an example of a piezoelectric generating element of the present invention.
Figure 10:
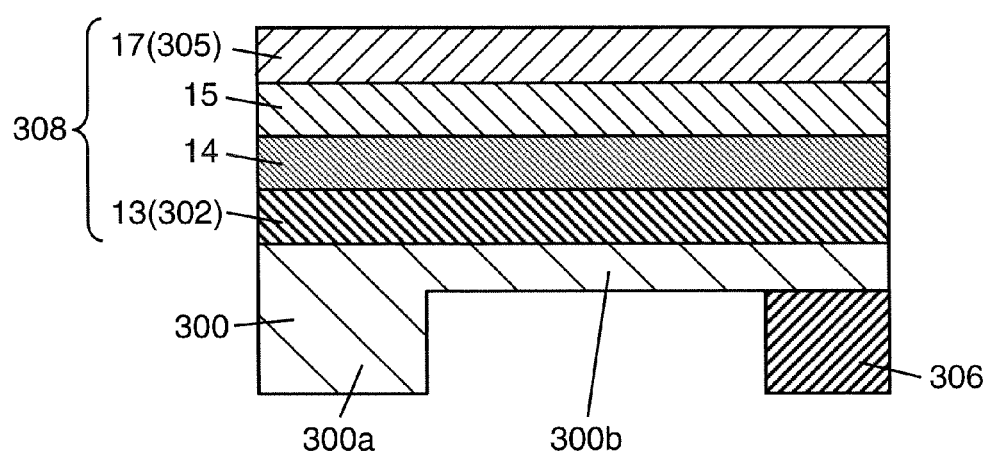
FIG. 10 is a cross-sectional view showing a cross section Fl of the piezoelectric generating element shown in FIG. 9.

FIG. 9 shows an example of the piezoelectric generating element of the present invention. FIG. 10 shows a cross section F1 of a piezoelectric generating element 22a shown in FIG. 9. The piezoelectric generating element 22a is an element that converts externally-applied mechanical vibrations into electrical energy. The piezoelectric generating element 22a is applied suitably to a self-sustained power supply for generating electric power from various vibrations including engine vibrations and driving vibrations generated in vehicles and machines, and vibrations generated during walking.

The piezoelectric generating element 22a shown in FIG. 9 includes a substrate 300 having a vibration part 300b and a piezoelectric film 308 bonded to the vibration part 300b.

The substrate 300 has a stationary part 300a, and the vibration part 300b having a beam extending in a predetermined direction from the stationary part 300a. The material of the stationary part 300a can be the same as the material of the vibration part 300b. These materials may, however, be different from each other. The stationary part 300a and the vibration part 300b made of materials different from each other may be bonded to each other.

The material of the substrate 300 is not limited. The material is, for example, Si, glass, ceramic, or metal. A monocrystalline Si substrate can be used as the substrate 300. The substrate 300 has a thickness of, for example, at least 0.1 mm but not more than 0.8 mm. The stationary part 300a may have a thickness different from that of the vibration part 300b. The thickness of the vibration part 300b can be adjusted for efficient power generation by changing the resonance frequency of the vibration part 300b.

A weight load 306 is bonded to the vibration part 300b. The weight load 306 adjusts the resonance frequency of the vibration part 300b. The weight load 306 is, for example, a vapor-deposited thin film of Ni. The material, shape, and mass of the weight load 306, as well as the position to which the weight load 306 is bonded can be adjusted according to a desired resonance frequency of the vibration part 300b. The weight load 306 may be omitted. The weight load 306 is not necessary when the resonance frequency of the vibration part 300b is not adjusted.

The piezoelectric film 308 is bonded to the vibration part 300b. The piezoelectric film 308 is the piezoelectric film described in the item titled as "Piezoelectric Film". As shown in FIG. 9 and FIG. 10, the piezoelectric film 308 comprises the first electrode 13 (302), the interface layer 14, the piezoelectric layer 15, and the second electrode 17 (305).

In the piezoelectric generating element shown in FIG. 9, a part of the first electrode 302 is exposed. This part can serve as a connection terminal 302a.

In the piezoelectric generating element shown in FIG. 9, the piezoelectric film 308 can be bonded to both of the vibration part 300b and the stationary part 300a. The piezoelectric film 308 can be bonded only to the vibration part 300b.

When the piezoelectric generating element of the present invention has a plurality of vibration parts 300b, an increased amount of electric power can be generated. Such a piezoelectric generating element can be applied to mechanical vibrations containing a wide range of frequency components if the plurality of vibration parts 300b have different resonance frequencies.

[Method of Generating Electric Power Using Piezoelectric Generating Element]

The above-described piezoelectric generating element of the present invention is vibrated to obtain electric power through the first electrode and the second electrode.

When mechanical vibration is applied externally to the piezoelectric generating element 22a, the vibration part 300b starts vibrating to produce vertical deflection with respect to the stationary part 300a. The piezoelectric effect produced by this vibration generates an electromotive force across the piezoelectric layer 15. As a result, a potential difference is generated between the first electrode 302 and the second electrode 305 that sandwich the piezoelectric layer 15 therebetween. Higher piezoelectric performance of the piezoelectric layer 15 generates a larger potential difference between the first and second electrodes. Particularly in the case where the resonance frequency of the vibration part 300b is close to the frequency of mechanical vibration to be applied externally to the element, the amplitude of the vibration part 300b increases and thus the electric power generation characteristics are improved. Therefore, the weight load 306 is preferably used to adjust the resonance frequency of the vibration part 300b to be close to the frequency of mechanical vibration applied externally to the element.

EXAMPLES

Hereinafter, the present invention is described in more detail with reference to the following examples.

Example 1

In Example 1, the piezoelectric film shown in FIG. 1B was fabricated as below.

11 First, a Pt layer having only a (110) orientation was formed on a MgO (110) monocrystalline substrate 11 by a sputtering technique. The Pt layer had a thickness of 250 nm. The Pt layer was the first electrode 13. The condition in the sputtering technique was as follows.

Target: metal platinum
Gas atmosphere: Argon
RF power: 15 W
Substrate temperature: 300° C.

Next, a $0.93(Na_xBi_{0.5})TiO_{0.5x+2.75}$-$0.07BaTiO_3$ layer 14 (x=0.350) having only a (110) orientation was formed on the Pt layer (the first electrode 13) by a sputtering technique. The $0.93(Na_xBi_{0.5})TiO_{0.5x+2.75}$-$0.07BaTiO_3$ layer 14 (x=0.350) had a thickness of 100 nanometers. The $0.93(Na_xBi_{0.5})TiO_{0.5x+2.75}$-$0.07BaTiO_3$ layer 14 (x=0.350) was an interface layer. The condition in the sputtering technique was as follows.

Target: the same composition as described above
Gas flow ratio: $Ar/O_2$=50/50
RF power: 170 W
Substrate temperature: 650° C.

Here, the composition of the formed $0.93(Na_xBi_{0.5})TiO_{0.5x+2.75}$-$0.07BaTiO_3$ layer 14 (x=0.350) was analyzed by an energy dispersive X-ray analysis method (SEM-EDX). In the measurement with use of SEM-EDX, it was difficult to quantify a light element such as oxygen accurately, since the analysis accuracy of the light element was low. However, it was confirmed that the composition of Na, Bi, Ba, and Ti contained in the formed $0.93(Na_xBi_{0.5})TiO_{0.5x+2.75}$-$0.07BaTiO_3$ layer 14 (x=0.350) was identical to the composition of the target.

Then, a $0.93(Bi_{0.5}Na_{0.5})TiO_3$-$0.07BaTiO_3$ layer 15 having only a (110) orientation was formed on the $0.93(Na_xBi_{0.5})TiO_{0.5x+2.75}$-$0.07BaTiO_3$ layer 14 (x=0.350) by a sputtering technique. The formed $0.93(Bi_{0.5}Na_{0.5})TiO_3$-$0.07BaTiO_3$ layer 15 had a thickness of 2.7 micrometers. The $0.93(Bi_{0.5}Na_{0.5})TiO_3$-$0.07BaTiO_3$ layer 15 was a piezoelectric layer. The condition in the sputtering technique was as follows.

Target: the same composition as described above
Gas flow ratio: $Ar/O_2$=50/50
RF power: 170 W
Substrate temperature: 650° C.

The composition of the formed $0.93(Bi_{0.5}Na_{0.5})TiO_3$-$0.07BaTiO_3$ layer 15 was analyzed by an energy dispersive X-ray analysis method (SEM-EDX). It was confirmed that the composition of Na, Bi, Ba, and Ti contained in the formed $0.93(Bi_{0.5}Na_{0.5})TiO_3$-$0.07BaTiO_3$ layer 15 was identical to the composition of the target.

Finally, a Au layer (the second electrode 17) having a thickness of 100 nanometers was formed on the $0.93(Bi_{0.5}Na_{0.5})TiO_3$-$0.07BaTiO_3$ layer 15 by a vapor deposition technique. Thus, the piezoelectric film according to Example 1 was obtained.

(X-ray Diffraction Analysis)

The formed $0.93(Bi_{0.5}Na_{0.5})TiO_3$-$0.07BaTiO_3$ layer 15 was subjected to an X-ray diffraction analysis to analyze the crystal structure thereof. The X-ray diffraction analysis was carried out in such a manner that the 0.93(Bi0.5Na0.5)TiO3-0.07BaTiO$_3$ layer 15 was irradiated with X-ray beam.

Figure 2:
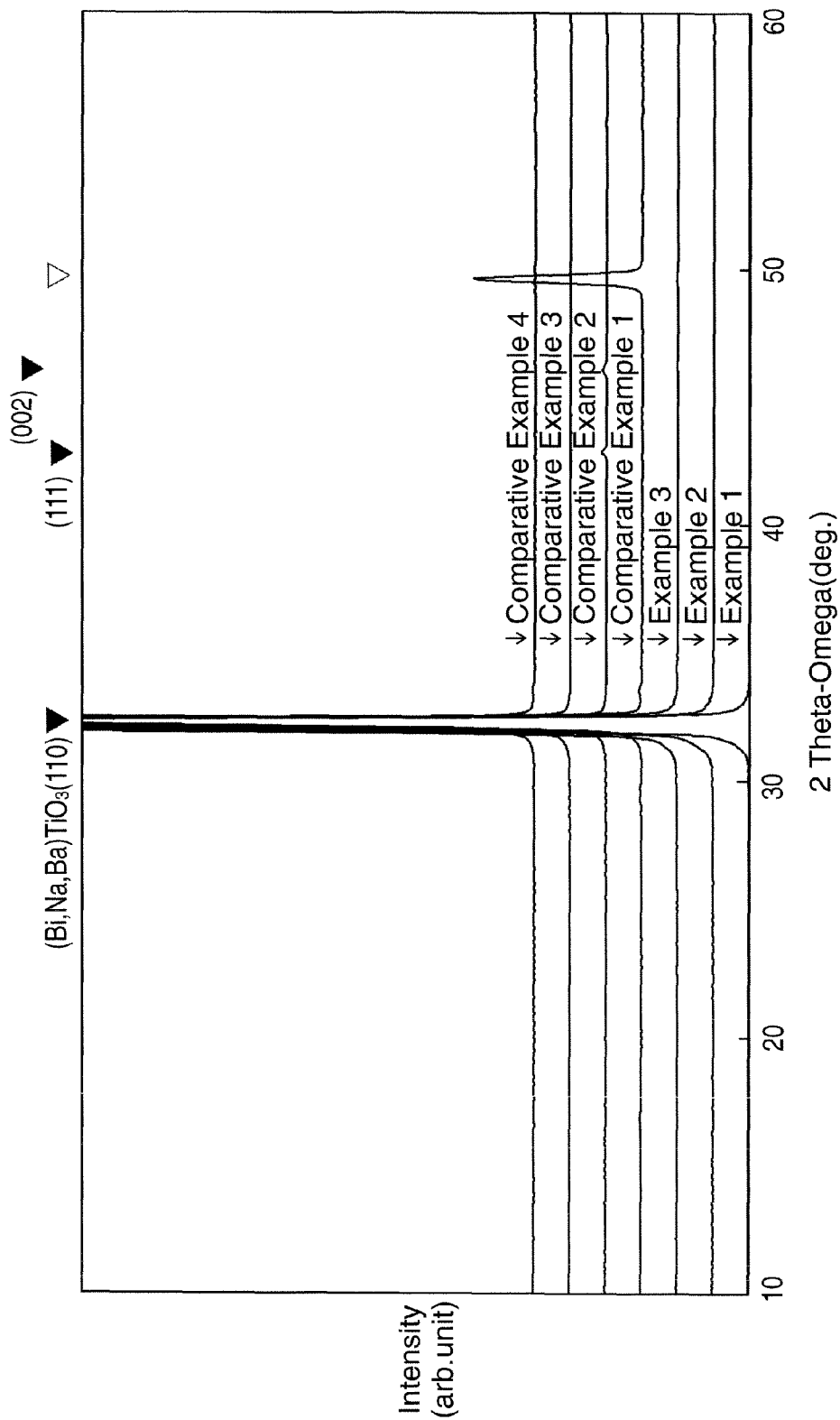
FIG. 2 shows the X-ray diffraction profiles of piezoelectric films according to Examples 1 to 3 and Comparative Examples 1 to 4.

FIG. 2 shows the result of the X-ray diffraction analysis, namely the X-ray diffraction profile. In Examples 2 to 3 and Comparative Examples 1 to 4, X-ray diffraction analyses were carried out in the same manner. FIG. 2 shows not only the result of the X-ray diffraction analysis according to Example 1, but also the results of the X-ray diffraction analyses according to Examples 2 to 3 and Comparative Examples 1 to 4.

As shown in FIG. 2, observed was only the reflection peak derived from the 0.93(Bi$_{0.5}$Na$_{0.5}$)TiO$_3$-0.07BaTiO$_3$ layer 15 having only a (110) orientation, except for the reflection peak derived from the Pt layer. The intensity of the (110) reflection peak was a significantly high value of 489,581 cps. The profile shown in FIG. 2 means that the 0.93(Bi$_{0.5}$Na$_{0.5}$)TiO$_3$-0.07BaTiO$_3$ layer 15 according to Example 1 has a significantly high (110) crystalline orientation.

(Measurement of Piezoelectric Constant d$_{31}$)

The piezoelectric performance of the piezoelectric film was evaluated in the following manner. The piezoelectric film was cut into a strip with a width of 2 mm and worked into a cantilever shape. A potential difference was applied between the first electrode 13 and the second electrode 17, and the resulting displacement of the cantilever was measured with a laser displacement meter. The measured displacement was converted into a piezoelectric constant d$_{31}$. The piezoelectric constant d$_{31}$ of the piezoelectric film according to Example 1 was −123 pC/N.

(Measurement of Leak Current)

An impedance analyzer was used to measure the dielectric loss (tangent delta) at 1 kHz. The dielectric loss (tangent delta) of the piezoelectric film according to Example 1 was 5.2%. This means that the piezoelectric film according to Example 1 had a small leak current property.

(Evaluation of Ferroelectric Property)

Figure 3:
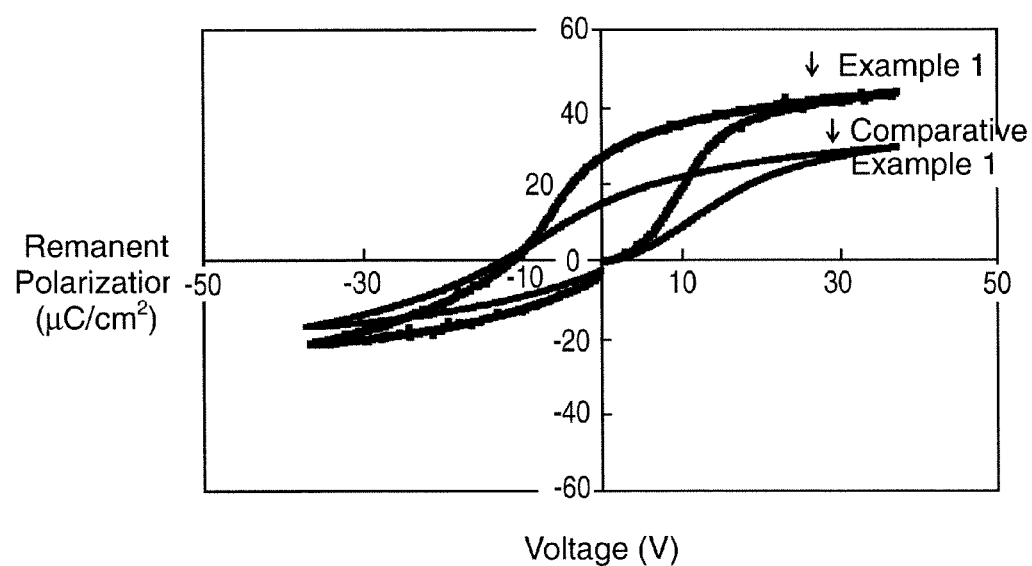
FIG. 3 shows the P-E hysteresis loops of the piezoelectric films according to Example 1 and Comparative Example 1.

A potential difference was applied between the first electrode 13 and the second electrode 17 to evaluate the ferroelectric property of the piezoelectric film according to Example 1. FIG. 3 shows a P-E hysteresis loop of the piezoelectric film according to Example 1. As is clear from FIG. 3, the piezoelectric film according to Example 1 had a more excellent ferroelectric property than the piezoelectric film according to Comparative Example 1, which is described later.

Example 2

The experiment identical to that of Example 1 was performed except that x=0.40.

Example 3

The experiment identical to that of Example 1 was performed except that x=0.29.

Comparative Example 1

The experiment identical to that of Example 1 was performed except that the 0.93(Na$_x$Bi$_{0.5}$)TiO$_{0.5x+2.75}$-0.07BaTiO$_3$ layer 14 (x=0.350) was not formed.

The piezoelectric property of the piezoelectric film according to Comparative Example 1 is shown in FIG. 3. The dielectric loss (tangent delta) of the piezoelectric film according to Comparative Example 1 was 9.8%. This means that the piezoelectric film according to Comparative Example 1 had a large leak current property.

Comparative Example 2

The experiment identical to that of Example 1 was performed except that an interface layer made of (Na$_{0.5}$Bi$_{0.5}$)TiO$_3$ was used instead of the 0.93(Na$_x$Bi$_{0.5}$)TiO$_{0.5x+2.75}$-0.07BaTiO$_3$ layer 14 (x=0.350).

Comparative Example 3

The experiment identical to that of Example 1 was performed except that x=0.425.

Comparative Example 4

The experiment identical to that of Example 1 was performed except that x=0.280.

Comparative Example 5

The experiment identical to that of Example 1 was performed except that an interface layer made of TiO$_2$ was used instead of the 0.93(Na$_x$Bi$_{0.5}$)TiO$_{0.5x+2.75}$-0.07BaTiO$_3$ layer 14 (x=0.350).

Comparative Example 6

The experiment identical to that of Example 1 was performed except that an interface layer made of Bi$_4$TiO$_3$O$_{12}$ was used instead of the 0.93(Na$_x$Bi$_{0.5}$)TiO$_{0.5x+2.75}$-0.07BaTiO$_3$ layer 14 (x=0.350).

Comparative Example 7

The experiment identical to that of Example 1 was performed except that an interface layer made of Na$_2$TiO$_3$ was used instead of the 0.93(Na$_x$Bi$_{0.5}$)TiO$_{0.5x+2.75}$-0.07BaTiO$_3$ layer 14 (x=0.350).

Comparative Example 8

The experiment identical to that of Example 1 was performed except that an interface layer made of BaTiO$_3$ was used instead of the 0.93(Na$_x$Bi$_{0.5}$)TiO$_{0.5x+2.75}$-0.07BaTiO$_3$ layer 14 (x=0.350).

Comparative Example 9

The experiment identical to that of Example 1 was performed except that an interface layer made of Bi$_4$Ti$_3$O$_{12}$—BaTiO$_3$ was used instead of the 0.93(Na$_x$Bi$_{0.5}$)TiO$_{0.5x+2.75}$-0.07BaTiO$_3$ layer 14 (x=0.350).

Comparative Example 10

The experiment identical to that of Example 1 was performed except that an interface layer made of Na$_2$TiO$_3$—BaTiO$_3$ was used instead of the 0.93(Na$_x$Bi$_{0.5}$)TiO$_{0.5x+2.75}$-0.07BaTiO$_3$ layer 14 (x=0.350).

The experimental results of Examples 1 to 3 and Comparative Examples 1 to 10 are summarized in Table 1.

TABLE 1

| | Substrate | First electrode | Interface layer | (110) peak intensity | Piezoelectric constant $d_{31}$ |
|---|---|---|---|---|---|
| Comparative Example 1 | MgO(110) | Pt (110) | (Not formed) | 71,534 cps | −68 pC/N |
| Comparative Example 2 | | | $(Na_{0.5}Bi_{0.5})TiO_3$ | 94,681 cps | −71 pC/N |
| Comparative Example 3 | | | x = 0.425 | 95,031 cps | −71 pC/N |
| Example 2 | | | x = 0.400 | 249,993 cps | −110 pC/N |
| Example 1 | | | x = 0.350 | 489,581 cps | −123 pC/N |
| Example 3 | | | x = 0.290 | 286,779 cps | −115 pC/N |
| Comparative Example 4 | | | x = 0.280 | 102,051 cps | −79 pC/N |
| Comparative Example 5 | | | $TiO_2$ | 122 cps | — |
| Comparative Example 6 | | | $Bi_4Ti_3O_{12}$ | 256 cps | — |
| Comparative Example 7 | | | $Na_2TiO_3$ | 511 cps | — |
| Comparative Example 8 | | | $BaTiO_3$ | 8,631 cps | — |
| Comparative Example 9 | | | $Bi_4Ti_3O_{12}$—$BaTiO_3$ | 1,582 cps | — |
| Comparative Example 10 | | | $Na_2TiO_3$—$BaTiO_3$ | 2,552 cps | — |

Table 1 shows that the $(Na_xBi_{0.5})TiO_{0.5x+2.75}$—$BaTiO_3$ layer 14 (0.29≤x≤0.40) having only a (110) orientation improves the (110) peak intensity and the piezoelectric constant of the $(Bi_{0.5}Na0.5)TiO_3$—$BaTiO_3$ layer 15 having only a (110) orientation.

Example 2 and Comparative Example 3 mean that the value of x is required to be not more than 0.4.

Example 3 and Comparative Example 4 mean that the value of x is required to be not less than 0.29.

Industrial Applicability

The BNT-BT piezoelectric film according to the present invention is used for an ink jet head, an angular velocity sensor, and a piezoelectric generating element.

REFERENCE SIGNS LIST

1a: piezoelectric film
1b: piezoelectric film
16a: multilayer structure
13: first electrode
14: $(Na_xBi_{0.5})TiO_{0.5x+2.75}$—$BaTiO_3$ layer (0.29≤x≤0.40) (interface layer)
15: $(Bi,Na)TiO_3$—$BaTiO_3$ layer
17: second electrode

The invention claimed is:

1. A piezoelectric film comprising:
a first electrode having only a (110) orientation;
a $(Na_xBi_{0.5})TiO_{0.5x+2.75}$—$BaTiO_3$ layer having only a (110) orientation;
a $(Bi,Na)TiO_3$—$BaTiO_3$ layer having only a (110) orientation; and
a second electrode, wherein
a value of x is not less than 0.29 and not more than 0.40, and
the first electrode, the $(Na_xBi_{0.5})TiO_{0.5x+2.75}$—$BaTiO_3$ layer, the $(Bi,Na)TiO_3$—$BaTiO_3$ layer, and the second electrode are laminated in this order.

2. An ink jet head comprising:
a piezoelectric film having a piezoelectric layer sandwiched between a first electrode and a second electrode;
a vibration layer bonded to the piezoelectric film; and
a pressure chamber member having a pressure chamber for storing ink and bonded to a surface of the vibration layer opposite to a surface to which the piezoelectric film is bonded,
wherein the vibration layer is bonded to the piezoelectric film so that the vibration layer is displaceable in its film thickness direction according to a deformation of the piezoelectric film produced by a piezoelectric effect,
the vibration layer and the pressure chamber member are bonded to each other so that a volumetric capacity of the pressure chamber changes according to a displacement of the vibration layer and so that the ink in the pressure chamber is ejected according to a change in the volumetric capacity of the pressure chamber,
the first electrode comprises only a (110) orientation,
the piezoelectric layer is composed of a $(Bi,Na)TiO_3$—$BaTiO_3$ layer having only a (110) orientation,
a $(Na_xBi_{0.5})TiO_{0.5x+2.75}$—$BaTiO_3$ layer with only a (110) orientation (x represents not less than 0.29 and not more than 0.4) is interposed between the first electrode and the piezoelectric layer, and
the first electrode, the $(Na_xBi_{0.5})TiO_{0.5x+2.75}$—$BaTiO_3$ layer, the $(Bi,Na)TiO_3$—$BaTiO_3$ layer, and the second electrode are laminated in this order.

3. A method of forming an image by an ink jet head, the method comprising steps of:
preparing the ink jet head, wherein
the ink jet head includes:
a piezoelectric film having a piezoelectric layer sandwiched between a first electrode and a second electrode;
a vibration layer bonded to the piezoelectric film; and
a pressure chamber member having a pressure chamber for storing ink and bonded to a surface of the vibration layer opposite to a surface to which the piezoelectric film is bonded,
the vibration layer is bonded to the piezoelectric film so that the vibration layer is displaceable in its film thickness direction according to a deformation of the piezoelectric film produced by a piezoelectric effect,
the vibration layer and the pressure chamber member are bonded to each other so that a volumetric capacity of the pressure chamber changes according to a displacement of the vibration layer and so that the ink in the pressure chamber is ejected according to a change in the volumetric capacity of the pressure chamber, the first electrode comprises only a (110) orientation, the piezoelectric layer is composed of a (Bi,Na)TiO$_3$—BaTiO$_3$ layer having only a (110) orientation, a (Na$_x$Bi$_{0.5}$)TiO$_{0.5x+2.75}$—BaTiO$_3$ layer with only a (110) orientation (x represents not less than 0.29 and not more than 0.4) is interposed between the first electrode and the piezoelectric layer, and the first electrode, the (Na$_x$Bi$_{0.5}$)TiO$_{0.5x+2.75}$—BaTiO$_3$ layer, the (Bi,Na)TiO$_3$—BaTiO$_3$ layer, and the second electrode are laminated in this order; and applying a voltage to the piezoelectric layer through the first electrode and the second electrode to displace, based on the piezoelectric effect, the vibration layer in its film thickness direction so that the volumetric capacity of the pressure chamber changes and the ink is ejected from the pressure chamber by the displacement.

4. An angular velocity sensor comprising:

a substrate having a vibration part; and a piezoelectric film bonded to the vibration part and having a piezoelectric layer sandwiched between a first electrode and a second electrode, wherein the first electrode comprises only a (110) orientation, the piezoelectric layer is composed of a (Bi,Na)TiO$_3$—BaTiO$_3$ layer having only a (110) orientation, a (Na$_x$Bi$_{0.5}$)TiO$_{0.5x+2.75}$—BaTiO$_3$ layer with only a (110) orientation (x represents not less than 0.29 and not more than 0.4) is interposed between the first electrode and the piezoelectric layer, the first electrode, the (Na$_x$Bi$_{0.5}$)TiO$_{0.5x+2.75}$—BaTiO$_3$ layer, the (Bi,Na)TiO$_3$—BaTiO$_3$ layer, and the second electrode are laminated in this order, and one electrode selected from the first electrode and the second electrode is composed of an electrode group including a drive electrode for applying a driving voltage that oscillates the vibration part to the piezoelectric layer and a sense electrode for measuring a deformation of the vibration part caused by an angular velocity applied to the oscillating vibration part.

5. A method of measuring an angular velocity by an angular velocity sensor, the method comprising steps of preparing the angular velocity sensor, wherein the angular velocity sensor includes: a substrate having a vibration part; and a piezoelectric film bonded to the vibration part and having a piezoelectric layer sandwiched between a first electrode and a second electrode, the first electrode comprises only a (110) orientation, the piezoelectric layer is composed of a (Bi,Na)TiO$_3$—BaTiO$_3$ layer having only a (110) orientation, a (Na$_x$Bi$_{0.5}$)TiO$_{0.5x+2.75}$—BaTiO$_3$ layer with only a (110) orientation (x represents not less than 0.29 and not more than 0.4) is interposed between the first electrode and the piezoelectric layer, and the first electrode, the (Na$_x$Bi$_{0.5}$)TiO$_{0.5x+2.75}$—BaTiO$_3$ layer, the (Bi,Na)TiO$_3$—BaTiO$_3$ layer, and the second electrode are laminated in this order, and one electrode selected from the first electrode and the second electrode is composed of an electrode group including a drive electrode and a sense electrode;

applying a driving voltage to the piezoelectric layer through the drive electrode and the other electrode selected from the first electrode and the second electrode to oscillate the vibration part; and measuring, through the other electrode and the sense electrode, a deformation of the vibration part caused by an angular velocity applied to the oscillating vibration part to obtain a value of the applied angular velocity.

6. A piezoelectric generating element comprising:

a substrate having a vibration part; and a piezoelectric film bonded to the vibration part and having a piezoelectric layer sandwiched between a first electrode and a second electrode, wherein the first electrode comprises only a (110) orientation, the piezoelectric layer is composed of a (Bi,Na)TiO$_3$—BaTiO$_3$ layer having only a (110) orientation, a (Na$_x$Bi$_{0.5}$)TiO$_{0.5x+2.75}$—BaTiO$_3$ layer with only a (110) orientation (x represents not less than 0.29 and not more than 0.4) is interposed between the first electrode and the piezoelectric layer, and the first electrode, the (Na$_x$Bi$_{0.5}$)TiO$_{0.5x+2.75}$—BaTiO$_3$ layer, the (Bi,Na)TiO$_3$—BaTiO$_3$ layer, and the second electrode are laminated in this order.

7. A method for generating an electric power using a piezoelectric generating element, the method comprising steps of:

preparing the piezoelectric generating element, wherein the piezoelectric generating element comprises:

a substrate having a vibration part; and a piezoelectric film bonded to the vibration part and having a piezoelectric layer sandwiched between a first electrode and a second electrode, the first electrode comprises only a (110) orientation, the piezoelectric layer is composed of a (Bi,Na)TiO$_3$—BaTiO$_3$ layer having only a (110) orientation, a (Na$_x$Bi$_{0.5}$)TiO$_{0.5x+2.75}$—BaTiO$_3$ layer with only a (110) orientation (x represents not less than 0.29 and not more than 0.4) is interposed between the first electrode and the piezoelectric layer, and the first electrode, the (Na$_x$Bi$_{0.5}$)TiO$_{0.5x+2.75}$—BaTiO$_3$ layer, the (Bi,Na)TiO$_3$—BaTiO$_3$ layer, and the second electrode are laminated in this order; and vibrating the vibration part to obtain electric power through the first electrode and the second electrode.

* * * * *